(12) United States Patent
Fukushima et al.

(10) Patent No.: US 12,641,719 B2
(45) Date of Patent: May 26, 2026

(54) WIRING CIRCUIT BOARD

(71) Applicant: NITTO DENKO CORPORATION, Osaka (JP)

(72) Inventors: Rihito Fukushima, Osaka (JP); Shusaku Shibata, Osaka (JP); Teppei Niino, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 232 days.

(21) Appl. No.: 18/253,894

(22) PCT Filed: Oct. 26, 2021

(86) PCT No.: PCT/JP2021/039450

§ 371 (c)(1),
(2) Date: May 22, 2023

(87) PCT Pub. No.: WO2022/113612

PCT Pub. Date: Jun. 2, 2022

(65) Prior Publication Data

US 2024/0023237 A1     Jan. 18, 2024

(30) Foreign Application Priority Data

Nov. 25, 2020     (JP) ................................. 2020-195567

(51) Int. Cl.
*H05K 1/02* (2006.01)
*H05K 1/18* (2026.01)
*H05K 1/189* (2026.01)

(52) U.S. Cl.
CPC ........... *H05K 1/0281* (2013.01); *H05K 1/189* (2013.01); *H05K 2201/0191* (2013.01); *H05K 2201/09727* (2013.01)

(58) Field of Classification Search
CPC ........ H05K 1/0281; H05K 1/189; H05K 1/05; H05K 1/0271; H05K 1/181;
(Continued)

(56) References Cited

U.S. PATENT DOCUMENTS

2005/0139371 A1* 6/2005 Ishimaru ................ H05K 1/111
174/541
2007/0074899 A1* 4/2007 Aonuma .................. H05K 3/44
174/260
(Continued)

FOREIGN PATENT DOCUMENTS

JP       2001-101638 A     4/2001
JP       2006-310491 A     11/2006
(Continued)

OTHER PUBLICATIONS

International Search Report issued in PCT/JP2021/039450 on Jan. 25, 2022.
(Continued)

*Primary Examiner* — Roshn K Varghese
(74) *Attorney, Agent, or Firm* — Edwards Neils LLC; Jean C. Edwards, Esq.

(57) ABSTRACT

A wiring circuit board includes a first insulating layer and a conductive pattern. The conductive pattern has a first terminal, and a wiring connected to the first terminal. The wiring has a first portion disposed away from the first terminal, and a second portion disposed between the first terminal and the first portion. The first portion of the wiring and the first terminal include a portion consisting of the first conductive layer and the second conductive layer. The second portion of the wiring consists of the first conductive layer.

8 Claims, 11 Drawing Sheets

(58) Field of Classification Search
CPC . H05K 2201/0191; H05K 2201/09727; H05K
2201/09136; H05K 1/11; H05K 1/111;
G11B 21/21
See application file for complete search history.

(56) References Cited

U.S. PATENT DOCUMENTS

| | | | |
|---|---|---|---|
| 2007/0218781 A1* | 9/2007 | Yokai | H05K 1/118 |
| | | | 439/752 |
| 2008/0134500 A1* | 6/2008 | Ishii | H05K 1/0259 |
| | | | 29/830 |
| 2009/0098745 A1* | 4/2009 | Kamei | H05K 1/0248 |
| | | | 439/66 |
| 2016/0267927 A1 | 9/2016 | Kikuchi et al. | |
| 2017/0171970 A1 | 6/2017 | Tanabe et al. | |
| 2018/0122411 A1 | 5/2018 | Yamauchi et al. | |
| 2019/0279901 A1 | 9/2019 | Lin et al. | |
| 2021/0212208 A1 | 7/2021 | Shibata et al. | |

FOREIGN PATENT DOCUMENTS

| | | |
|---|---|---|
| JP | 2011-082302 A | 4/2011 |
| JP | 2011-175706 A | 9/2011 |
| JP | 2012-198957 A | 10/2012 |
| JP | 2016-170838 A | 9/2016 |
| JP | 2016-219543 A | 12/2016 |
| JP | 2017-107629 A | 6/2017 |
| JP | 2018-073446 A | 5/2018 |
| JP | 2019-204943 A | 11/2019 |
| JP | 2019-212349 A | 12/2019 |
| JP | 2020-188189 A | 11/2020 |

OTHER PUBLICATIONS

Written Opinion issued in PCT/JP2021/039450 on Jan. 25, 2022.
International Preliminary Report on Patentability issued by WIPO
on May 30, 2023, in connection with International Patent Application No. PCT/JP2021/039450.
Office Action issued by Taiwan Intellectual Property Office on Jun.
6, 2025, in connection with Taiwanese Patent Application No.
110141617.
Office Action, issued by the Japanese Patent Office on Aug. 5, 2025,
in connection with Japanese Patent Application No. 2022-565134.
Office Action issued by Korean Intellectual Property Office on Aug.
21, 2025, in connection with Korean Patent Application No. 10-2023-
7016850.

* cited by examiner

First direction

Second direction

WIRING CIRCUIT BOARD

CROSS-REFERENCE TO RELATED APPLICATIONS

The present application is a 35 U.S.C. 371 National Stage Entry of PCT/JP2021/039450, filed on Oct. 26, 2021, which claims priority from Japanese Patent Application No. 2020-195567, filed on Nov. 25, 2020, the contents of all of which are herein incorporated by reference in their entirety.

TECHNICAL FIELD

The present invention relates to a wiring circuit board.

BACKGROUND ART

Conventionally, a wiring circuit board includes a first insulating layer and a conductive pattern. The conductive pattern is disposed on the first insulating layer. The conductive pattern has a terminal and a wiring. The wiring is connected to the terminal. The terminal consists of a first conductive layer disposed on the first insulating layer, and a second conductive layer disposed on the first conductive layer (ref: for example, Patent Document 1 below).

CITATION LIST

Patent Document

Patent Document 1: Japanese Unexamined Patent Publication No. 2019-212349

SUMMARY OF THE INVENTION

Problem to be Solved by the Invention

In the wiring circuit board as described in Patent Document 1, there is a desire to ensure the ease of connection (mountability) to an electronic component, while reinforcing a desired portion.

The present invention provides a wiring circuit board capable of ensuring the mountability, while reinforcing a desired portion.

Means for Solving the Problem

The present invention [1] includes a wiring circuit board including a first insulating layer, and a conductive pattern disposed on the first insulating layer and having a terminal and a wiring connected to the terminal, the wiring having a first portion disposed away from the terminal and a second portion disposed between the terminal and the first portion, wherein the conductive pattern has a first conductive layer disposed on the first insulating layer and a second conductive layer disposed on the first conductive layer; the first portion of the wiring and the terminal include a portion consisting of the first conductive layer and the second conductive layer; and the second portion of the wiring consists of the first conductive layer or the second conductive layer.

According to such a configuration, of the wirings, the first portion which is disposed away from the terminal includes the portion consisting of the first conducive layer and the second conductive layer.

Thus, it is possible to reinforce a desired portion of the wiring circuit board using a part of the wiring (first portion).

Further, the terminal includes the portion consisting of the first conductive layer and the second conductive layer. The second portion disposed between the terminal and the first portion consists of the first conductive layer or the second conductive layer.

Therefore, when an electronic component is mounted on the terminal, it is possible to suppress the contact of the second portion of the wiring with the electronic component, and to reliably bring the second conductive layer of the terminal into contact with the electronic component.

As a result, it is possible to reliably connect the terminal to the electronic component. That is, it is possible to ensure the mountability of the wiring circuit board.

Overall, it is possible to ensure the mountability, while reinforcing the desired portion.

The present invention [2] includes a wiring circuit board including a first insulating layer; a conductive pattern disposed on the first insulating layer, having a terminal and a wiring connected to the terminal, the wiring having a first portion disposed away from the terminal and a second portion disposed between the terminal and the first portion, and having a first conductive layer disposed on the first insulating layer and a second conductive layer disposed on the first conductive layer; and an intermediate insulating layer disposed between the first conductive layer and the second conductive layer; wherein the terminal includes a portion consisting of the first conductive layer, the second conductive layer, and the intermediate insulating layer; the first portion of the wiring includes a portion consisting of the first conductive layer and the second conductive layer; and the second portion of the wiring consists of at least one of the first conductive layer and the second conductive layer.

According to such a configuration, of the wirings, the first portion which is disposed away from the terminal includes the portion consisting of the first conducive layer and the second conductive layer.

Thus, it is possible to reinforce the desired portion of the wiring circuit board using a part of the wiring (first portion).

Further, the terminal includes the portion consisting of the first conductive layer, the second conductive layer, and the intermediate insulating layer. The second portion disposed between the terminal and the first portion consists of at least one of the first conductive layer and the second conductive layer.

Therefore, when the electronic component is mounted on the terminal, it is possible to suppress the contact of the second portion of the wiring with the electronic component, and to reliably bring the second conductive layer of the terminal into contact with the electronic component.

As a result, it is possible to reliably connect the terminal to the electronic component. That is, it is possible to ensure the mountability of the wiring circuit board.

Overall, it is possible to ensure the mountability, while reinforcing the desired portion.

The present invention [3] includes the wiring circuit board of the above-described [1] or [2], wherein a width of the first portion is wider than the width of the second portion.

According to such a configuration, it is possible to reduce the electrical resistance of the wiring by increasing the cross-sectional area of the first portion of the wiring.

The present invention [4] includes the wiring circuit board of any one of the above-described [1] to [3] further including a second insulating layer disposed on the first insulating layer and covering the wiring, wherein the second insulating layer is disposed at an interval from the terminal.

According to such a configuration, when the electronic component is mounted on the terminal, it is possible to suppress the contact of the second insulating layer with the electronic component.

As a result, it is possible to further improve the mountability of the wiring circuit board.

The present invention [5] includes the wiring circuit board of the above-described [4], wherein the second insulating layer disposed on the second portion is thinner than the second conductive layer of the terminal.

According to such a configuration, when the electronic component is mounted on the terminal, it is possible to further suppress the contact of the second insulating layer with the electronic component.

As a result, it is possible to further improve the mountability of the wiring circuit board.

The present invention [6] includes the wiring circuit board of any one of the above-described [1] to [3] further including a second insulating layer disposed on the first insulating layer and covering the wiring, wherein the second insulating layer disposed on the second portion is thinner than the second conductive layer of the terminal.

According to such a configuration, when the electronic component is mounted on the terminal, it is possible to suppress the contact of the second insulating layer with the electronic component.

As a result, it is possible to further improve the mountability of the wiring circuit board.

The present invention [7] includes the wiring circuit board of any one of the above-described [1] to [6], wherein the second portion of the wiring consists of the first conductive layer and the entire second conductive layer is in contact with the first conductive layer.

According to such a configuration, it is possible to reduce the electrical resistance of the wiring by increasing the cross-sectional area of the first portion of the wiring.

The present invention [8] includes the wiring circuit board of any one of the above-described [1] to [6], wherein the second portion of the wiring consists of the second conductive layer and the entire first conductive layer is in contact with the second conductive layer.

According to such a configuration, it is possible to reduce the electrical resistance of the wiring by increasing the cross-sectional area of the first portion of the wiring.

Effect of the Invention

According to the wiring circuit board of the present invention, it is possible to ensure the mountability, while reinforcing a desired portion.

DESCRIPTION OF EMBODIMENTS

1. Wiring Circuit Board

Figure 1:
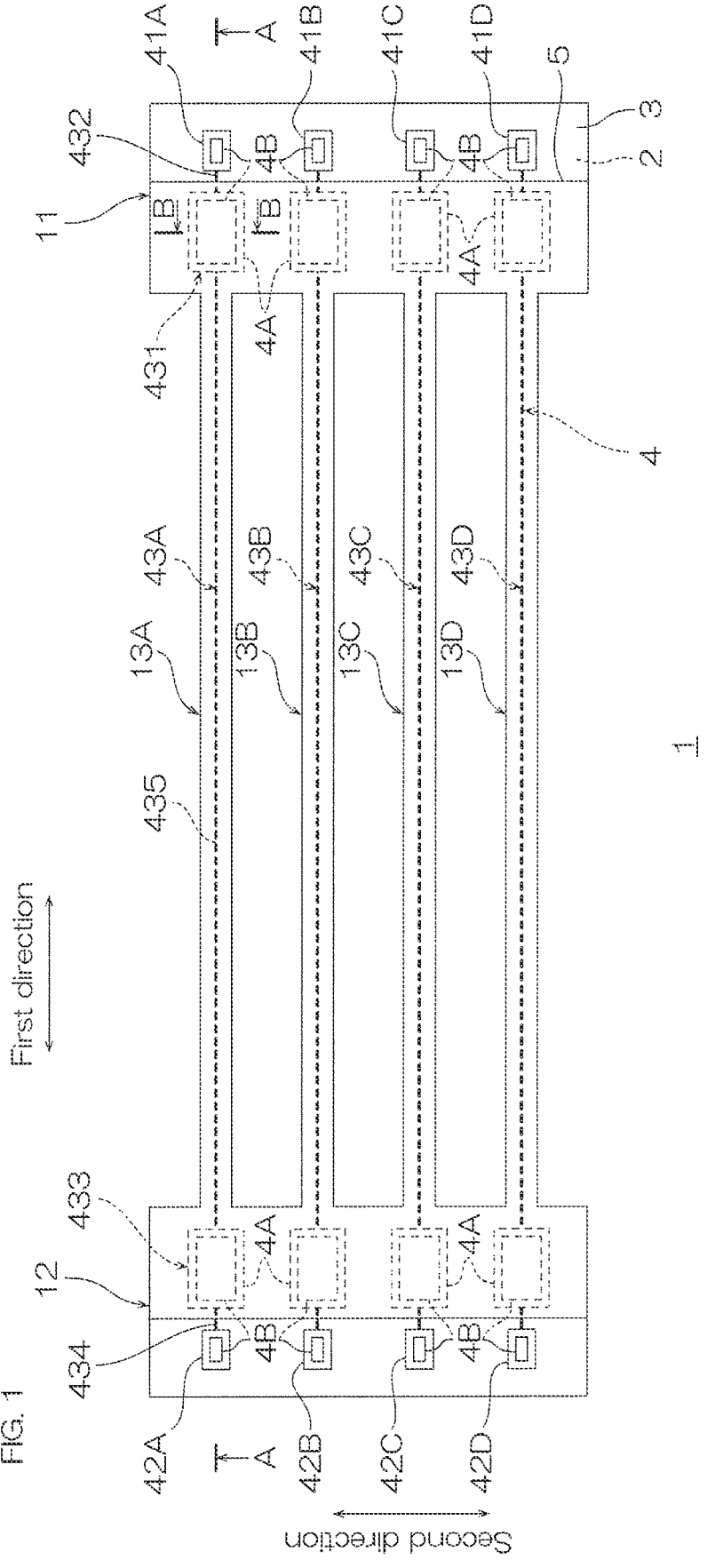
FIG. 1 shows a plan view of a wiring circuit board as one embodiment of the present invention.

As shown in FIG. 1, a wiring circuit board 1 as one embodiment of the present invention extends in a first direction. The wiring circuit board 1 is a flexible wiring circuit board. The wiring circuit board 1 has a sheet shape. The wiring circuit board 1 has a first end portion 11, a second end portion 12, and a plurality of flexible portions 13A, 13B, 13C, and 13D. The number of flexible portions is not limited.

The first end portion 11 is one end portion of the wiring circuit board 1 in the first direction. In the present embodiment, the first end portion 11 has a rectangular shape. A shape of the first end portion 11 is not limited.

The second end portion 12 is the other end portion of the wiring circuit board 1 in the first direction. The second end portion 12 is disposed away from the first end portion 11 in the first direction. In the present embodiment, the second end portion 12 has a rectangular shape. The shape of the second end portion 12 is not limited.

The flexible portions 13A, 13B, 13C, and 13D are disposed between the first end portion 11 and the second end portion 12 in the first direction. Each of the flexible portions 13A, 13B, 13C, and 13D extends in the first direction. The flexible portions 13A, 13B, 13C, and 13D are arranged in a second direction, and disposed at spaced intervals from each other. In the present embodiment, the second direction is perpendicular to the first direction. Each of the flexible portions 13A, 13B, 13C, and 13D is narrower than the first end portion 11 and the second end portion 12 in the second direction. Each of the flexible portions 13A, 13B, 13C, and 13D is more flexible than the first end portion 11 and the second end portion 12.

Figures 2A, 2B:
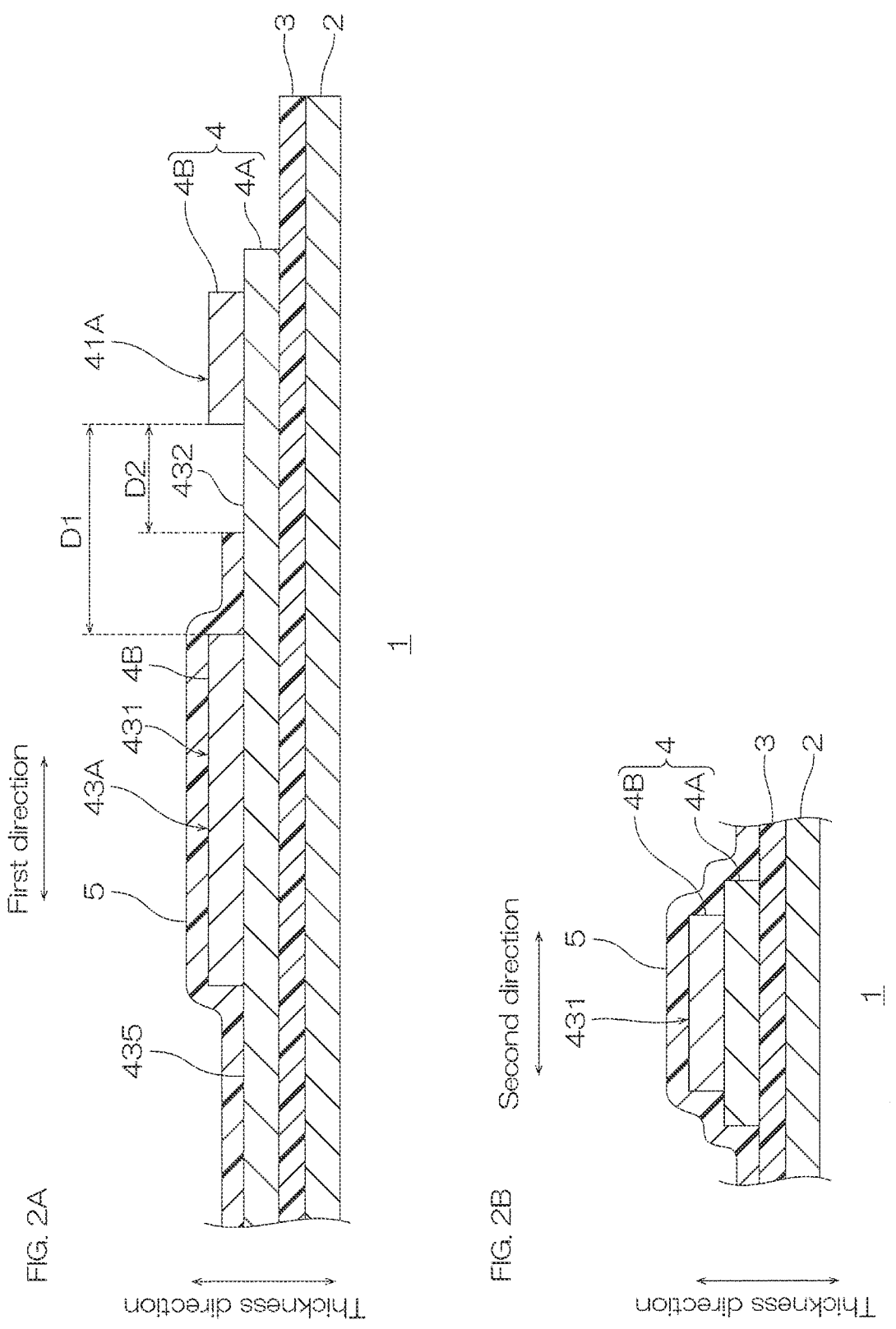
FIG. 2A shows an A-A cross-sectional view of the wiring circuit board shown in FIG. 1.
FIG. 2B shows a B-B cross-sectional view of the wiring circuit board shown in FIG. 1.

As shown in FIG. 2A, the wiring circuit board 1 includes a metal supporting layer 2, a first insulating layer 3, a conductive pattern 4, and a second insulating layer 5.

(1) Metal Supporting Layer

The metal supporting layer 2 extends in the first direction. The metal supporting layer 2 supports the first insulating layer 3, the conductive pattern 4, and the second insulating layer 5. The metal supporting layer 2 is made of metal. Examples of the metal include stainless alloys and copper alloys.

A thickness of the metal supporting layer 2 is, for example, 15 μm or more, preferably 20 μm or more. When the thickness of the metal supporting layer 2 is the above-described lower limit value or more, it is possible to ensure the elasticity of the wiring circuit board 1. The thickness of the metal supporting layer 2 is, for example, 500 μm or less, preferably 250 μm or less. When the thickness of the metal supporting layer 2 is the above-described upper limit value or less, it is possible to ensure the flexibility of the wiring circuit board 1.

(2) First Insulating Layer

The first insulating layer 3 is disposed on the metal supporting layer 2 in a thickness direction of the wiring circuit board 1. The thickness direction is perpendicular to the first direction and the second direction. The first insulating layer 3 is disposed between the metal supporting layer 2 and the conductive pattern 4 in the thickness direction. The first insulating layer 3 insulates the metal supporting layer 2 from the conductive pattern 4. The first insulating layer 3 is made of a resin having flexibility. An example of the resin includes polyimide.

The thickness of the first insulating layer 3 is not limited, as long as it can insulate the metal supporting layer 2 from the conductive pattern 4. The thickness of the first insulating layer 3 is, for example, 1 μm or more, preferably 3 μm or more, and for example, 50 μm or less, preferably 35 μm or less.

(3) Conductive Pattern

The conductive pattern 4 is disposed on the first insulating layer 3 in the thickness direction. The conductive pattern 4 is disposed at the opposite side of the metal supporting layer 2 with respect to the first insulating layer 3 in the thickness direction. The conductive pattern 4 is made of metal. An example of the metal includes copper.

(3-1) Shape of Conductive Pattern

As shown in FIG. 1, the conductive pattern 4 has a plurality of first terminals 41A, 41B, 41C, and 41D, a plurality of second terminals 42A, 42B, 42C, and 42D, and a plurality of wirings 43A, 43B, 43C, and 43D. The number of first terminals, the number of second terminals, and the number of wirings are not limited. The first terminal 41A is one example of a terminal.

The first terminals 41A, 41B, 41C, and 41D are disposed in the first end portion 11. In the present embodiment, the first terminals 41A, 41B, 41C, and 41D are arranged in a second direction, and disposed at spaced intervals from each other. Each of the first terminals 41A, 41B, 41C, and 41D has a square land shape.

The second terminals 42A, 42B, 42C, and 42D are disposed in the second end portion 12. In the present embodiment, the second terminals 42A, 42B, 42C, and 42D are arranged in a second direction, and disposed at spaced intervals from each other. Each of the second terminals 42A, 42B, 42C, and 42D has a square land shape.

The wiring 43A electrically connects the first terminal 41A to the second terminal 42A. One end of the wiring 43A is connected to the first terminal 41A. The other end of the wiring 43A is connected to the second terminal 42A. In the present embodiment, the wiring 43A has a first portion 431, a second portion 432, a third portion 433, a fourth portion 434, and a fifth portion 435.

The first portion 431 is disposed in the first end portion 11. The first portion 431 is disposed in the middle of the wiring 43A. The first portion 431 is disposed away from the first terminal 41A in the first direction.

An interval D1 (ref: FIG. 2) between the first portion 431 and the first terminal 41A is, for example, 0.03 mm or more, preferably 0.1 mm or more, more preferably 0.2 mm or more, and for example, 10 mm or less, preferably 5 mm or less.

The first portion 431 extends in the first direction and the second direction. The first portion 431 has a flat plate shape.

In the present embodiment, the first portion 431 has a rectangular shape. The first portion 431 is larger than the first terminal 41A. A width (length in the second direction) of the first portion 431 is wider than the width of the second portion 432 and the fifth portion 435. Thus, it is possible to reduce the electrical resistance of the wiring 43A by increasing the cross-sectional area of the first portion 431 of the wiring 43A. Further, it is possible to reinforce the first end portion 11 by disposing the first portion 431 in the first end portion 11. In other words, it is possible to reinforce a part of the wiring circuit board 1 in the vicinity of the first terminal 41A. Thus, it is possible to further improve the mountability of the wiring circuit board 1.

The second portion 432 is disposed between the first terminal 41A and the first portion 431 in the first direction. The second portion 432 electrically connects the first terminal 41A to the first portion 431. One end of the second portion 432 is connected to the first terminal 41A. The other end of the second portion 432 is connected to the first portion 431.

The third portion 433 is disposed in the second end portion 12. The third portion 433 is disposed away from the first portion 431 in the first direction. The third portion 433 is disposed in the middle of the wiring 43A. The third portion 433 is disposed away from the second terminal 42A in the first direction. In the present embodiment, the interval between the third portion 433 and the second terminal 42A is the same as the interval D1 between the first portion 431 and the first terminal 41A. The interval between the third portion 433 and the second terminal 42A may be also different from the interval D1 between the first portion 431 and the first terminal 41A. In addition, in the present embodiment, the third portion 433 has the same shape as the first portion 431. The third portion 433 may also have a shape different from that of the first portion 431. The third portion 433 is larger than the second terminal 42A. The width of the third portion 433 is wider than the width of the fourth portion 434 and the fifth portion 435. Thus, it is possible to reduce the electrical resistance of the wiring 43A by increasing the cross-sectional area of the third portion 433 of the wiring 43A. Further, it is possible to reinforce the second end portion 12 by disposing the third portion 433 in the second end portion 12. In other words, it is possible to reinforce a part of the wiring circuit board 1 in the vicinity of the second terminal 42A. Thus, it is possible to further improve the mountability of the wiring circuit board 1.

The fourth portion 434 is disposed between the second terminal 42A and the third portion 433 in the first direction. The fourth portion 434 electrically connects the second terminal 42A to the third portion 433. One end of the fourth portion 434 is connected to the second terminal 42A. The other end of the fourth portion 434 is connected to the third portion 433.

The fifth portion 435 is disposed in the flexible portion 13A. The fifth portion 435 extends along the flexible portion 13A. The fifth portion 435 electrically connects the first portion 431 to the third portion 433. One end of the fifth portion 435 is connected to the first portion 431. The other end of the fifth portion 435 is connected to the third portion 433.

The description of the wirings 43B, 43C, and 43D is the same as that of the wiring 43A. Therefore, the description of the wirings 43B, 43C, and 43D is omitted.

(3-2) Layer Structure of Conductive Pattern

As shown in FIG. 2A, the conductive pattern 4 has a first conductive layer 4A and a second conductive layer 4B.

The first conductive layer 4A is provided in the first terminal 41A, the second terminal 42A (ref: FIG. 1), and the entire wiring 43A. The first conductive layer 4A is disposed on the first insulating layer 3 in the thickness direction. The second portion 432 of the wiring 43A, the fourth portion 434 of the wiring 43A (ref: FIG. 1), and the fifth portion 435 of the wiring 43A consist of the first conductive layer 4A without having the second conductive layer 4B.

Thus, when an electronic component is mounted on the first terminal 41A, it is possible to suppress the contact of the second portion 432 of the wiring 43A with the electronic component, and to reliably bring the second conductive layer 4B of the first terminal 41A into contact with the electronic component. As a result, it is possible to reliably connect the first terminal 41A to the electronic component. Further, when the electronic component is mounted on the second terminal 42A, it is possible to suppress the contact of the fourth portion 434 of the wiring 43A with the electronic component, and to reliably bring the second conductive layer 4B of the second terminal 42A into contact with the electronic component. As a result, it is possible to reliably connect the second terminal 42A to the electronic component. That is, it is possible to ensure the mountability of the wiring circuit board 1.

The thickness of the first conductive layer 4A is, for example, 1 µm or more, preferably 3 µm or more, and for example, 50 µm or less, preferably 30 µm or less.

That is, the thickness of the second portion 432 of the wiring 43A, the fourth portion 434 of the wiring 43A, and the fifth portion 435 of the wiring 43A is, for example, 1 µm or more, preferably 3 µm or more, and for example, 50 µm or less, preferably 30 µm or less.

The second conductive layer 4B is provided in the first terminal 41A, the second terminal 42A (ref: FIG. 1), the first portion 431 of the wiring 43A, and the third portion 433 of the wiring 43A (ref: FIG. 1). That is, the first terminal 41A, the second terminal 42A, the first portion 431 of the wiring 43A, and the third portion 433 of the wiring 43A include a portion consisting of the first conductive layer 4A and the second conductive layer 4B. Thus, it is possible to reinforce a desired portion of the wiring circuit board 1 using a part of the wiring 43A (the first portion 431).

The thickness of the second conductive layer 4B is, for example, 1 µm or more, preferably 3 µm or more, and for example, 50 µm or less, preferably 30 µm or less.

The first terminal 41A, the second terminal 42A, the first portion 431 of the wiring 43A, and the third portion 433 of the wiring 43A are thicker than the second portion 432 of the wiring 43A, the fourth portion 434 of the wiring 43A, and the fifth portion 435 of the wiring 43A. The thickness of the first terminal 41A, the second terminal 42A, the first portion 431 of the wiring 43A, and the third portion 433 of the wiring 43A is, for example, 1 µm or more, preferably 3 µm or more, and for example, 50 µm or less, preferably 30 µm or less.

As shown in FIG. 1, in the present embodiment, the second conductive layer 4B is disposed inside the edge of the first conductive layer 4A in the first terminal 41A, the second terminal 42A, the first portion 431 of the wiring 43A, and the third portion 433 of the wiring 43A. Thus, as shown in FIG. 2B, a peripheral edge portion of the first portion 431 of the wiring 43A has a stair shape. The third portion 433 of the wiring 43A, the first terminal 41A, and the second terminal 42A are also the same as the first portion 431 of the wiring 43A.

As shown in FIGS. 2A and 2B, the second conductive layer 4B is disposed on the first conductive layer 4A in the thickness direction. In the present embodiment, the entire second conductive layer 4B is in contact with the first conductive layer 4A. Thus, it is possible to reduce the electrical resistance of the wiring 43A by increasing the cross-sectional area of the first portion 431 and the third portion 433 of the wiring 43A.

The description of the layer structure of the first terminal 41B (ref: FIG. 1), the second terminal 42B (ref: FIG. 1), and the wiring 43B (ref: FIG. 1), the description of the layer structure of the first terminal 41C (ref: FIG. 1), the second terminal 42C (ref: FIG. 1), and the wiring 43C (ref: FIG. 1), and the description of the layer structure of the first terminal 41D (ref: FIG. 1), the second terminal 42D (ref: FIG. 1), and the wiring 43D (ref: FIG. 1) are the same as the description of the layer structure of the first terminal 41A, the second terminal 42A, and the wiring 43A.

Therefore, the description of the layer structure of the first terminal 41B, the second terminal 42B, and the wiring 43B, the description of the layer structure of the first terminal 41C, the second terminal 42C, and the wiring 43C, and the description of the layer structure of the first terminal 41D, the second terminal 42D, and the wiring 43D are omitted.

(4) Second Insulating Layer

As shown in FIG. 1, the second insulating layer 5 covers the wiring 43A. The second insulating layer 5 also covers the wirings 43B, 43C, and 43D. The second insulating layer 5 is disposed on the first insulating layer 3.

As shown in FIGS. 1 and 2A, the second insulating layer 5 does not cover the first terminal 41A, and one end of the second portion 432 of the wiring 43A. The second insulating layer 5 is disposed at an interval from the first terminal 41A in the first direction. Thus, when the electronic component is mounted on the first terminal 41A, it is possible to suppress the contact of the second insulating layer 5 with the electronic component. As a result, it is possible to further improve the mountability of the wiring circuit board 1.

An interval D2 between the second insulating layer 5 and the first terminal 41A is, for example, 0.01 mm or more, preferably 0.05 mm or more, and for example, 1 mm or less, preferably 0.1 mm or less.

As shown in FIG. 1, the second insulating layer 5 is disposed at an interval from the second terminal 42A in the first direction. The second insulating layer 5 does not cover the second terminal 42A, and one end of the fourth portion 434 of the wiring 43A.

The second insulating layer 5 is also disposed at an interval from the first terminals 41B, 41C, and 41D, and the second terminals 42B, 42C, and 42D in the first direction. The second insulating layer 5 does not cover the first terminals 41B, 41C, and 41D, one end of the second portions 432 of each of the wirings 43B, 43C, and 43D, the second terminals 42B, 42C, and 42D, and one end of the fourth portions 434 of each of the wirings 43B, 43C, and 43D.

As shown in FIG. 2A, the second insulating layer 5 disposed on the second portion 432 is thinner than the second conductive layer 4B of the first terminal 41A. Thus, when the electronic component is mounted on the first terminal 41A, it is possible to suppress the contact of the second insulating layer 5 with the electronic component. As a result, it is possible to further improve the mountability of the wiring circuit board 1.

The thickness of the second insulating layer 5 is, for example, 1 µm or more, preferably 3 µm or more, and for example, 60 µm or less, preferably 40 µm or less.

A ratio of the thickness of the second insulating layer 5 to the thickness of the second conductive layer 4B is, for example, below 100%, preferably 90% or less, more preferably 75% or less, and for example, 10% or more.

Further, as shown in FIGS. 1 and 2B, the second insulating layer 5 covers the entire peripheral edge portion of the first portion 431. It is possible to increase the contact area between the second insulating layer 5 and the conductive pattern 4 by the second insulating layer 5 covering the entire peripheral edge portion of the first portion 431. As a result, it is possible to suppress the peeling of the second insulating layer 5 from the conductive pattern 4.

2. Function and Effect (1) According to the wiring circuit board 1, as shown in FIG. 2A, of the wirings 43A, the first portion 431 which is disposed away from the first terminal 41A includes the portion consisting of the first conductive layer 4A and the second conductive layer 4B.

Thus, it is possible to reinforce a part of the wiring 43A (the first portion 431) by the second conductive layer 4B. In the present embodiment, it is possible to reinforce a part of the wiring circuit board 1 in the vicinity of the first terminal 41A by reinforcing the first portion 431.

Further, the first terminal 41A includes the portion consisting of the first conductive layer 4A and the second conductive layer 4B. The second portion 432 disposed between the first terminal 41A and the first portion 431 consists of the first conductive layer 4A.

Therefore, when the electronic component is mounted on the first terminal 41A, it is possible to suppress the contact of the second portion 432 of the wiring 43A with the electronic component, and to reliably bring the second conductive layer 4B of the first terminal 41A into contact with the electronic component.

As a result, it is possible to reliably connect the first terminal 41A to the electronic component. That is, it is possible to ensure the mountability of the wiring circuit board 1.

Overall, it is possible to ensure the mountability, while reinforcing a desired portion using a part of the wiring 43A (the first portion 431).

(2) According to the wiring circuit board 1, as shown in FIG. 1, the width of the first portion 431 is wider than the width of the second portion 432.

Therefore, it is possible to reduce the electrical resistance of the wiring 43A by increasing the cross-sectional area of the first portion 431 of the wiring 43A.

(3) According to the wiring circuit board 1, as shown in FIG. 2A, the second insulating layer 5 is disposed at the interval D2 from the first terminal 41A.

Thus, when the electronic component is mounted on the first terminal 41A, it is possible to suppress the contact of the second insulating layer 5 with the electronic component.

As a result, it is possible to further improve the mountability of the wiring circuit board 1.

(4) According to the wiring circuit board 1, as shown in FIG. 2A, the second insulating layer 5 disposed on the second portion 432 is thinner than the second conductive layer 4B of the first terminal 41A.

Thus, when the electronic component is mounted on the first terminal 41A, it is possible to further suppress the contact of the second insulating layer 5 with the electronic component.

As a result, it is possible to further improve the mountability of the wiring circuit board 1.

(5) According to the wiring circuit board 1, as shown in FIG. 2A, the entire second conductive layer 4B is in contact with the first conductive layer 4A.

Thus, it is possible to reduce the electrical resistance of the wiring 43A by increasing the cross-sectional area of the first portion 431 of the wiring 43A.

3. Modified Examples

In the following, modified examples of a wiring circuit board are described with reference to FIGS. 3 to 11D. In each modified example below, the same reference numerals are provided for members corresponding to each of those in the above-described embodiment, and their detailed description is omitted.

Figure 3:
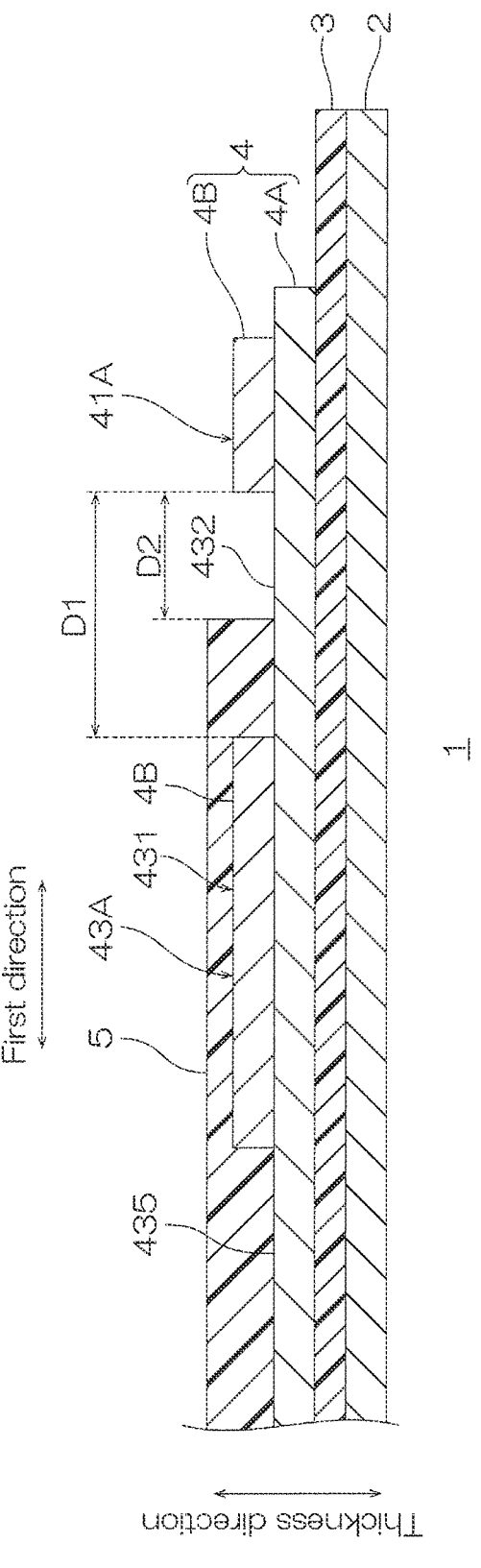
FIG. 3 shows an explanatory view for illustrating a first modified example.

(1) As shown in FIG. 3, the second insulating layer 5 disposed on the second portion 432 may be also thicker than the second conductive layer 4B of the first terminal 41A. In this case, from the viewpoint of the mountability of the wiring circuit board 1, the second insulating layer 5 is preferably disposed at the interval D2 from the first terminal 41A.

Figure 4:
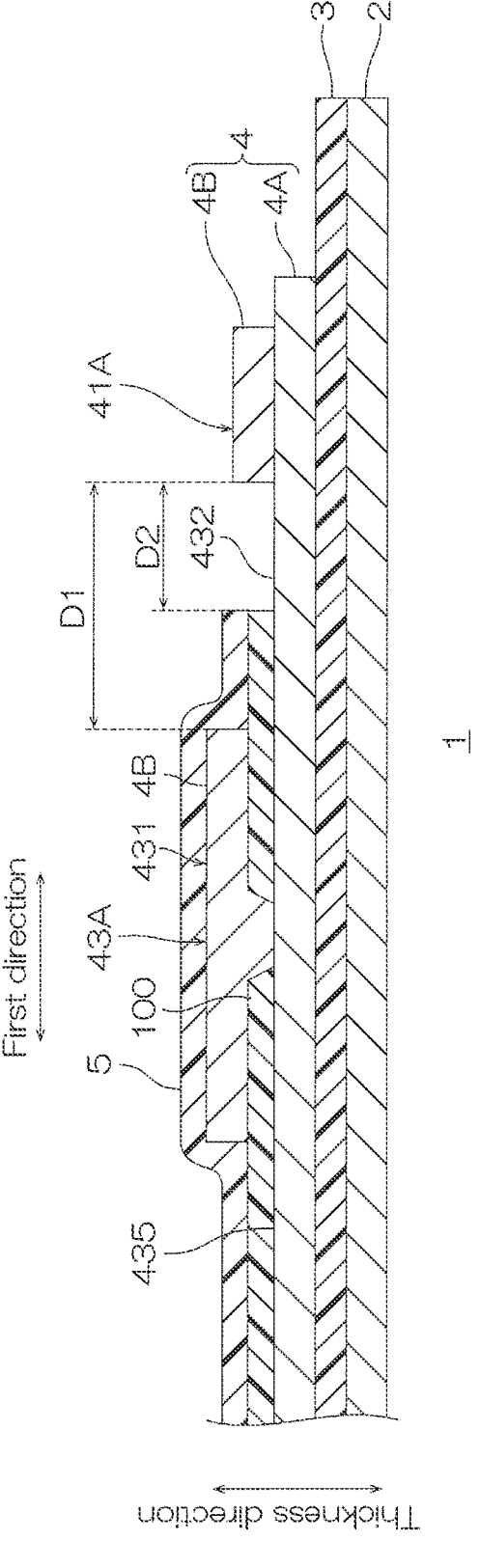
FIG. 4 shows an explanatory view for illustrating a second modified example.

(2) As shown in FIG. 4, only a part of the second conductive layer 4B may be also in contact with the first conductive layer 4A. Specifically, the wiring circuit board 1 further includes an intermediate insulating layer 100 disposed between the first conductive layer 4A and the second conductive layer 4B. The intermediate insulating layer 100 has a via 100A. Apart of the second conductive layer 4B is in contact with the first conductive layer 4A through the via 100A.

The thickness of the intermediate insulating layer 100 is, for example, 1 μm or more, preferably 3 μm or more, and for example, 60 μm or less, preferably 40 μm or less.

Figure 5:
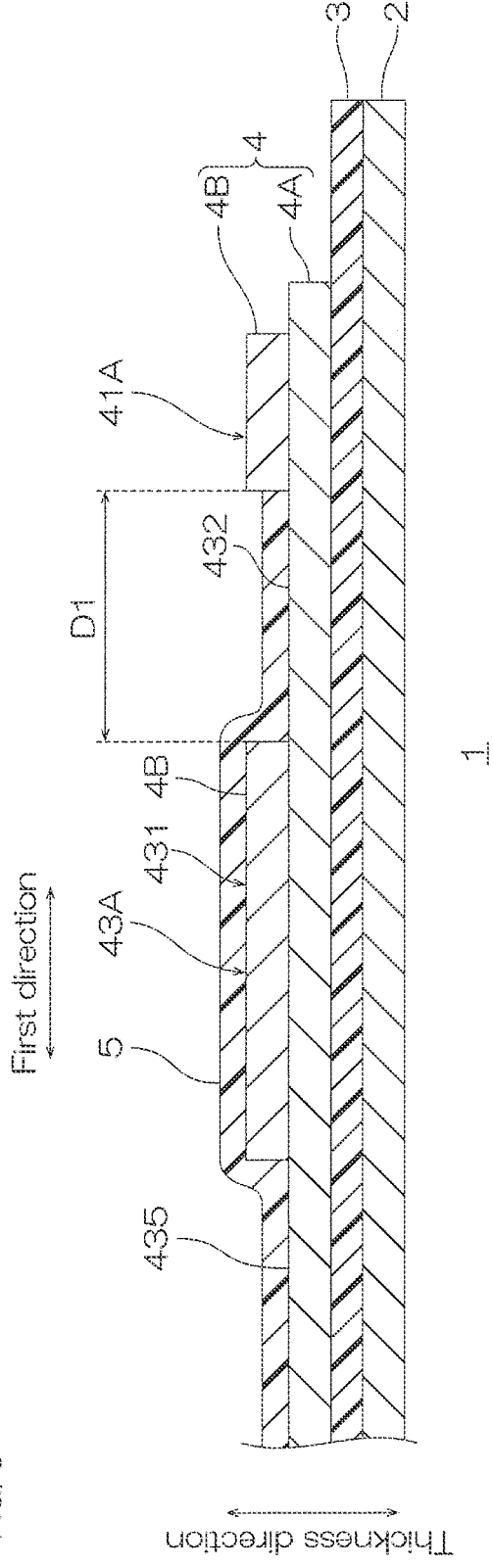
FIG. 5 shows an explanatory view for illustrating a third modified example.

(3) As shown in FIG. 5, the second insulating layer 5 may also cover the entire second portion 432. In other words, the interval D2 may not be disposed between the second insulating layer 5 and the first terminal 41A. In this case, from the viewpoint of the mountability of the wiring circuit board 1, the second insulating layer 5 disposed on the second portion 432 is preferably thinner than the second conductive layer 4B of the first terminal 41A.

Figure 6:
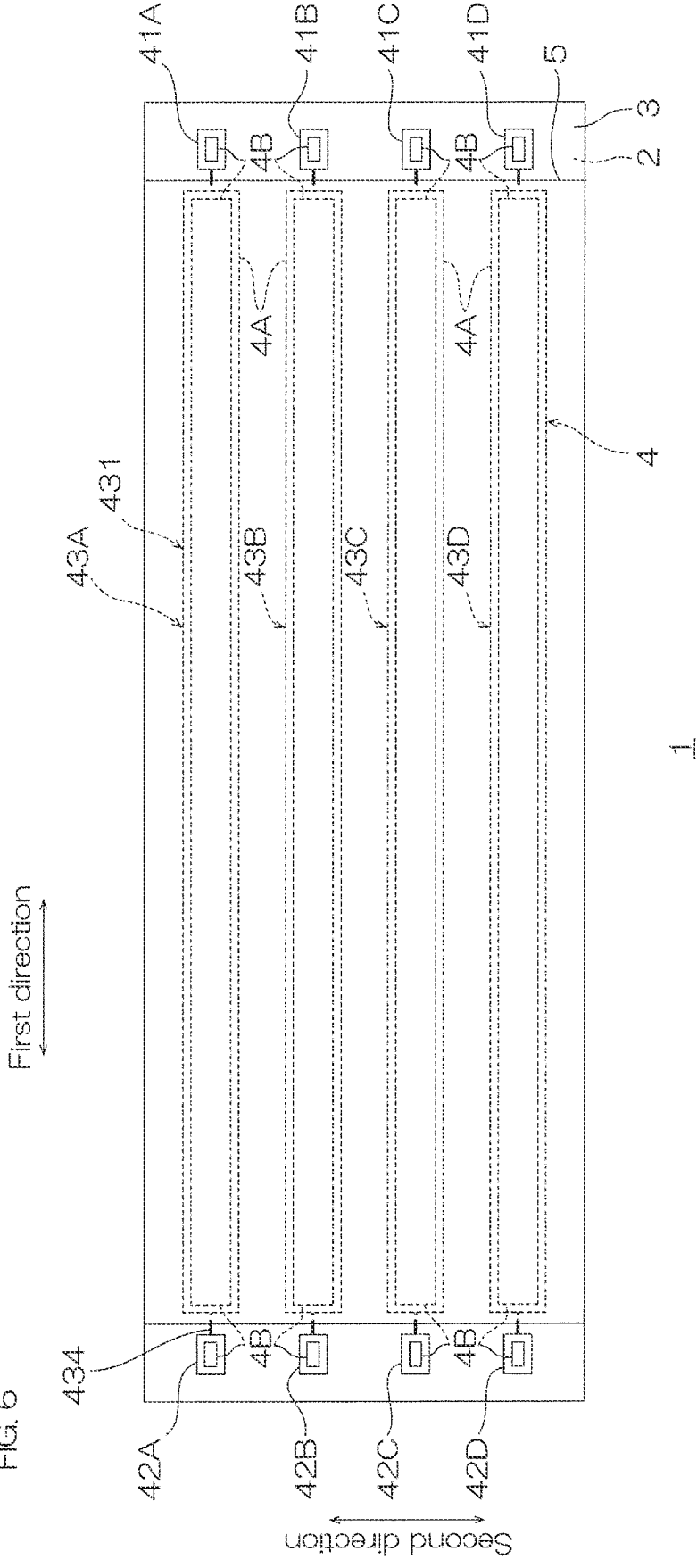
FIG. 6 shows an explanatory view for illustrating a fourth modified example.

(4) As shown in FIG. 6, the first portion 431 of the wiring 43A may also extend to the vicinity of the second terminal 42A. In this case, the wiring 43A does not have the third portion 433 and the fifth portion 435.

Figure 7:
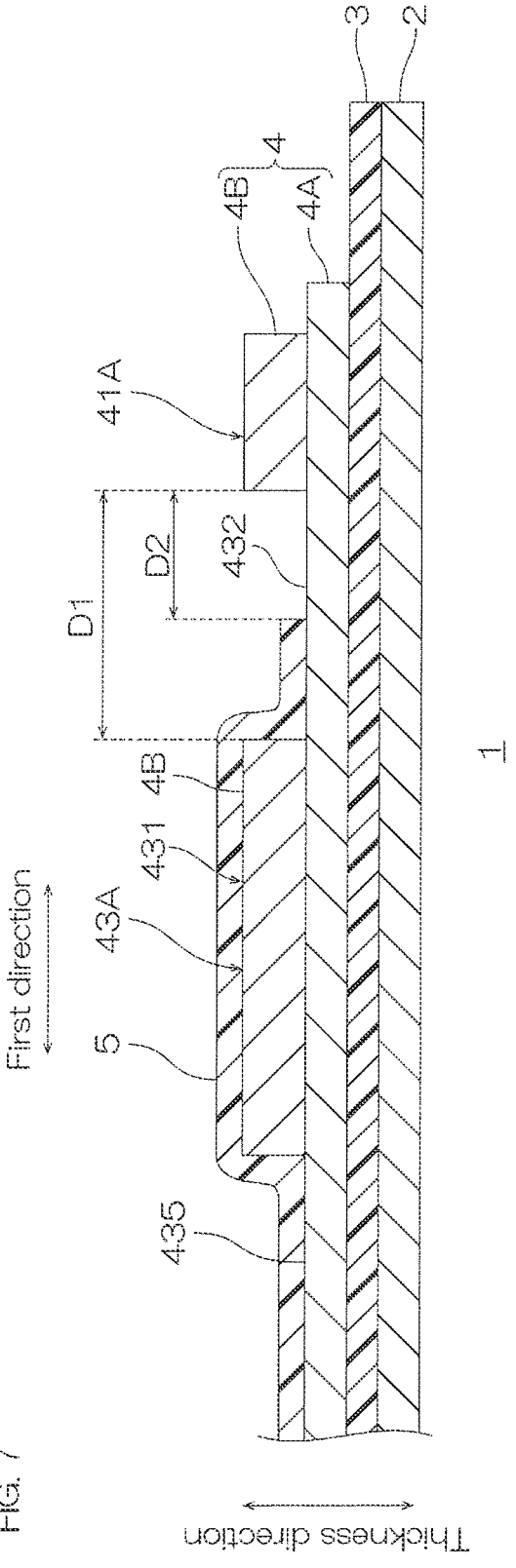
FIG. 7 shows an explanatory view for illustrating a fifth modified example.

(5) As shown in FIG. 7, the thickness of the second conductive layer 4B may be also different from the thickness of the first conductive layer 4A. In the modified example, the second conductive layer 4B is thicker than the first conductive layer 4A.

Figure 8:
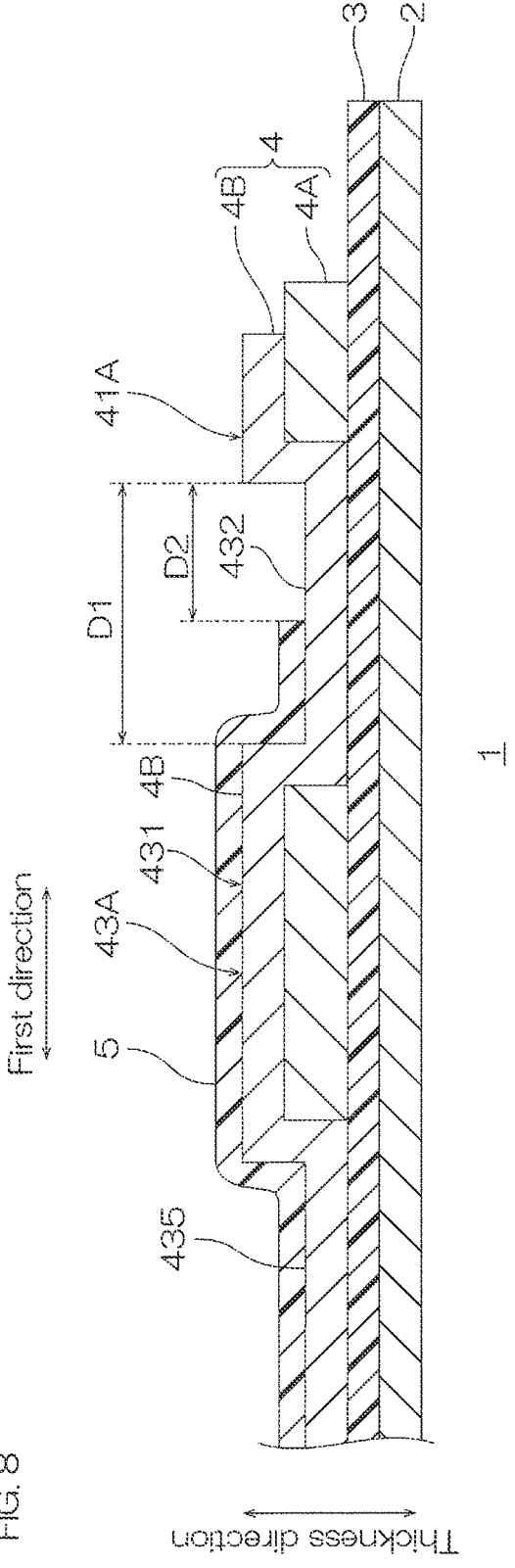
FIG. 8 shows an explanatory view for illustrating a sixth modified example.

(6) As shown in FIG. 8, the second conductive layer 4B may be also thinner than the first conductive layer 4B.

Further, the second portion 432 of the wiring 43A may also consist of the second conductive layer 4B. In this case, the first conductive layer 4A is provided in the first terminal 41A, the second terminal 42A (ref: FIG. 1), the first portion 431 of the wiring 43A, and the third portion 433 of the wiring 43A (ref: FIG. 1). The second conductive layer 4B is provided in the first terminal 41A, the second terminal 42A (ref: FIG. 1), and the entire wiring 43A. The entire first conducive layer 4A may be also in contact with the second conductive layer 4B.

Figure 9:
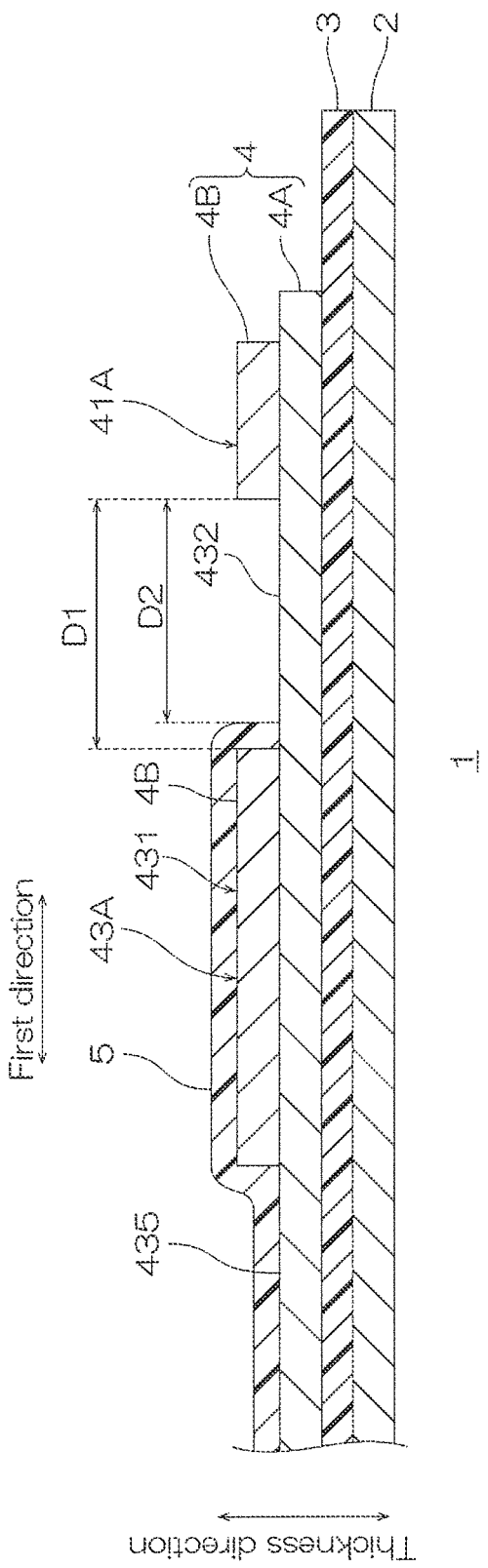
FIG. 9 shows an explanatory view for illustrating a seventh modified example.

(7) As shown in FIG. 9, the second insulating layer 5 may also cover the first portion 431 and the fifth portion 435 of the wiring 43A, and may also not cover the first terminal 41A, and the second portion 432 of the wiring 43A. In this case, the second insulating layer 5 covers the third portion 433 of the wiring 43A (ref: FIG. 1), and does not cover the second terminal 42A (ref: FIG. 1) and the fourth portion 434 of the wiring 43A (ref: FIG. 1).

Figure 10:
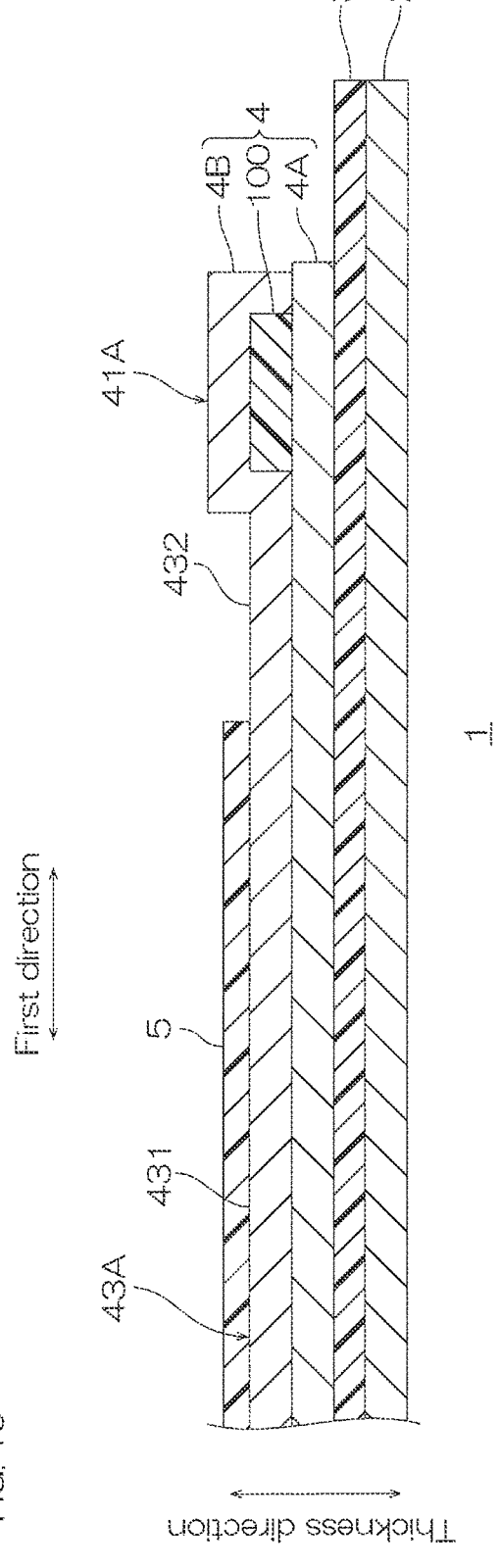
FIG. 10 shows an explanatory view for illustrating an eighth modified example.

(8) As shown in FIG. 10, the first terminal 41A may also include a portion consisting of the first conductive layer 4A, the second conductive layer 4B, and the intermediate insulating layer 100. In this case, the second portion 432 of the wiring 43A consists of at least one of the first conductive layer 4A and the second conductive layer 4B. In the modified example, the second portion 432 of the wiring 43A consists of the first conductive layer 4A and the second conductive layer 4B. The second portion 432 of the wiring 43A may also consist of the first conductive layer 4A, and may also consist of the second conductive layer 4B.

In the modified example, the thickness of the second conductive layer 4B may be also different from the thickness of the first conductive layer 4A. The second conductive layer 4B may be also thicker than the first conductive layer 4A, or may be also thinner than the first conductive layer 4B.

(9) As shown in FIGS. 11A to 11D, in the first terminal 41A or the second terminal 42A, each width of the first conductive layer 4A, the second conductive layer 4B, and the intermediate insulating layer 100 is not limited.

Figure 11A:
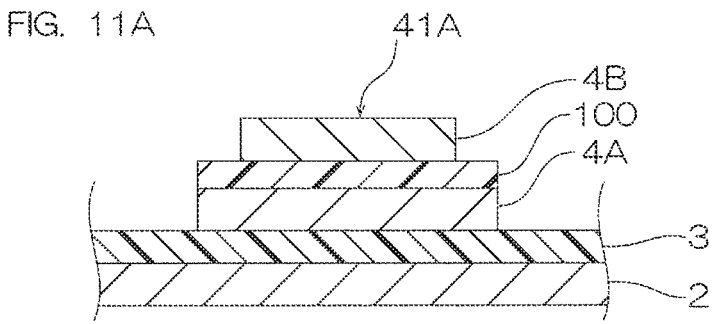
FIG. 11A shows an explanatory view for illustrating a ninth modified example.
Figure 11B:
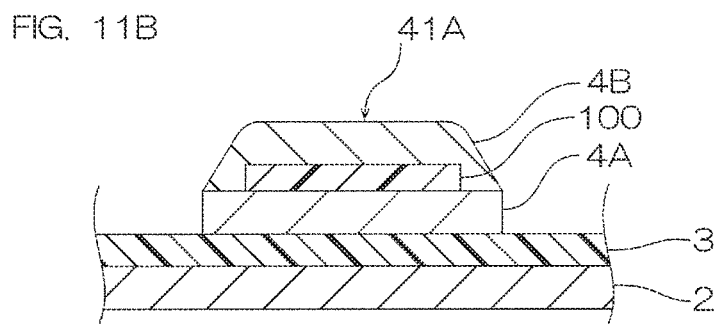
FIG. 11B shows an explanatory view for illustrating a tenth modified example.
Figure 11C:
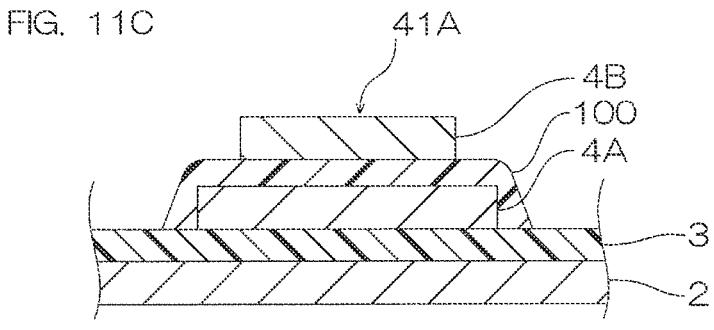
FIG. 11C shows an explanatory view for illustrating an eleventh modified example.

As shown in FIG. 11A, the edge of the intermediate insulating layer 100 may also coincide with the edge of the first conductive layer 4A. As shown in FIG. 11B, the intermediate insulating layer 100 may be also disposed inside the edge of the first conductive layer 4A. As shown in FIG. 11C, the first conductive layer 4A may be also disposed inside the edge of the intermediate insulating layer 100.

Figure 11D:
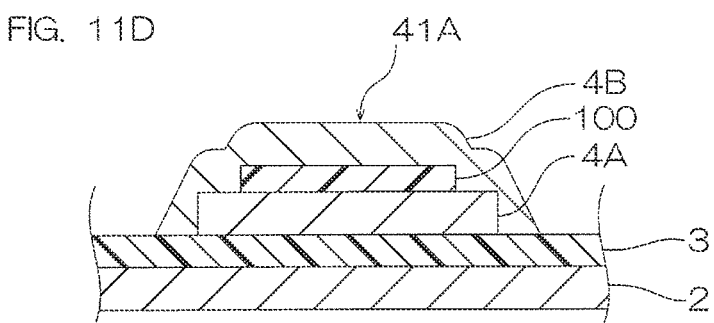
FIG. 11D shows an explanatory view for illustrating a twelfth modified example.

Further, as shown in FIG. 11D, the first conductive layer 4A may be also disposed inside the edge of the second conductive layer 4B.

(10) These modified examples can also achieve the same function and effect as that of the above-described embodiment.

While the illustrative embodiments of the present invention are provided in the above description, such is for illustrative purpose only and it is not to be construed as limiting the scope of the present invention. Modification and variation of the present invention that will be obvious to those skilled in the art is to be covered by the following claims.

INDUSTRIAL APPLICATION

The wiring circuit board of the present invention is used for connection to an electronic component.

DESCRIPTION OF REFERENCE NUMERALS

1 Wiring circuit board
3 First insulating layer
4 Conductive pattern
4A First conductive layer
4B Second conductive layer
5 Second insulating layer
41A First terminal
43A Wiring
431 First portion
432 Second portion
D2 Interval

The invention claimed is:
1. A wiring circuit board comprising:
a first insulating layer,

12 a conductive pattern disposed on the first insulating layer and having a first terminal, a second terminal, and a wiring electrically connecting the first terminal and the second terminal, the wiring having a first portion disposed away from the first terminal, the first portion being larger than the first terminal in a plan view, and a second portion disposed between the first terminal and the first portion, and a second insulating layer disposed on the first insulating layer and covering the wiring, wherein the second insulating layer covers the entire first portion;

the conductive pattern has a first conductive layer disposed on the first insulating layer and a second conductive layer disposed on the first conductive layer;

the first portion of the wiring and the first terminal include a portion consisting of the first conductive layer and the second conductive layer; and the second portion of the wiring consists of the first conductive layer or the second conductive layer.

2. The wiring circuit board according to claim 1, wherein a width of the first portion is wider than the width of the second portion.

3. The wiring circuit board according to claim 1 wherein the second insulating layer is disposed at an interval from the first terminal.

4. The wiring circuit board according to claim 3, wherein the second insulating layer disposed on the second portion is thinner than the second conductive layer of the first terminal.

5. The wiring circuit board according to claim 1 wherein the second insulating layer disposed on the second portion is thinner than the second conductive layer of the first terminal.

6. The wiring circuit board according to claim 1, wherein the second portion of the wiring consists of the first conductive layer and the entire second conductive layer is in contact with the first conductive layer.

7. The wiring circuit board according to claim 1, wherein the second portion of the wiring consists of the second conductive layer and the entire first conductive layer is in contact with the second conductive layer.

8. A wiring circuit board comprising:
a first insulating layer;
a conductive pattern disposed on the first insulating layer, having a first terminal, a second terminal, and a wiring electrically connecting the first terminal and the second terminal, the wiring having a first portion disposed away from the first terminal, the first portion being larger than the first terminal in a plan view, and a second portion disposed between the first terminal and the first portion, and the conductive pattern having a first conductive layer disposed on the first insulating layer and a second conductive layer disposed on the first conductive layer;
an intermediate insulating layer disposed between the first conductive layer and the second conductive layer; and
a second insulating layer disposed on the first insulating layer and covering the wiring,
wherein
the second insulating layer covers the entire first portion;

the first terminal includes a portion consisting of the first conductive layer, the second conductive layer, and the intermediate insulating layer;

the first portion of the wiring includes a portion consisting of the first conductive layer and the second conductive layer; and the second portion of the wiring consists of at least one of the first conductive layer and the second conductive layer.

* * * * *